US012033828B2

(12) United States Patent
Nagai et al.

(10) Patent No.: US 12,033,828 B2
(45) Date of Patent: Jul. 9, 2024

(54) ELECTRON-BEAM IRRADIATION APPARATUS AND MAINTENANCE METHOD FOR ELECTRON-BEAM IRRADIATION APPARATUS

(71) Applicant: NHV CORPORATION, Kyoto (JP)

(72) Inventors: Masahiro Nagai, Kyoto (JP); Toshio Kimura, Kyoto (JP)

(73) Assignee: NHV CORPORATION, Kyoto (JP)

( * ) Notice: Subject to any disclaimer, the term of this patent is extended or adjusted under 35 U.S.C. 154(b) by 0 days.

(21) Appl. No.: 18/287,461

(22) PCT Filed: Jun. 17, 2022

(86) PCT No.: PCT/JP2022/024269
§ 371 (c)(1),
(2) Date: Oct. 18, 2023

(87) PCT Pub. No.: WO2022/270424
PCT Pub. Date: Dec. 29, 2022

(65) Prior Publication Data
US 2024/0087836 A1    Mar. 14, 2024

(30) Foreign Application Priority Data
Jun. 23, 2021 (JP) ................. 2021-104146

(51) Int. Cl.
*H01J 37/06* (2006.01)
*H01J 37/16* (2006.01)
(52) U.S. Cl.
CPC .............. *H01J 37/06* (2013.01); *H01J 37/16* (2013.01); *H01J 2237/0473* (2013.01); *H01J 2237/06308* (2013.01)

(58) Field of Classification Search
CPC .......... H01J 37/06; H01J 37/065; H01J 37/16; H01J 37/18; H01J 2237/06;
(Continued)

(56) References Cited

U.S. PATENT DOCUMENTS

| 10,903,037 B2 * | 1/2021 | Kasuya ................. H01J 37/075 |
| 2011/0210247 A1 * | 9/2011 | Shachal .................. H01J 37/18 |
| | | 250/307 |
| 2018/0327126 A1 | 11/2018 | Cloetta et al. |

FOREIGN PATENT DOCUMENTS

| CN | 104465281 | 3/2015 |
| CN | 103299720 | 2/2016 |

(Continued)

OTHER PUBLICATIONS

"Decision of Refusal of Japan Counterpart Application", dated Jan. 17, 2023, with English translation thereof, pp. 1-10.
(Continued)

*Primary Examiner* — David E Smith
(74) *Attorney, Agent, or Firm* — JCIPRNET (57) ABSTRACT

An electron-beam irradiation apparatus includes: a power source device; an accelerating tube that accelerates electrons when power is supplied from the power source device, to generate an electron beam; and a pressure tank that contains the power source device and the accelerating tube. The pressure tank is configured so as to be dividable into a first division body that contains the power source device and a second division body that contains the accelerating tube. The second division body has an outlet for emitting the electron beam emitted from the accelerating tube, to the outside of the pressure tank. In addition, the power source device has a connecting part connected to the second division body.

5 Claims, 5 Drawing Sheets

(58) Field of Classification Search
CPC ......... H01J 2237/06308; H01J 2237/16; H01J 2237/166
See application file for complete search history.

(56) References Cited

FOREIGN PATENT DOCUMENTS

| | | | |
|---|---|---|---|
| CN | 209593872 | | 11/2019 |
| CN | 110856335 | | 2/2020 |
| DE | 112012003182 | | 6/2021 |
| JP | H0992495 | | 4/1997 |
| JP | H11224799 | | 8/1999 |
| JP | 2001160500 | | 6/2001 |
| JP | 2001160500 A | * | 6/2001 |
| JP | 2014194392 | | 10/2014 |
| JP | 2014194392 A | * | 10/2014 |

OTHER PUBLICATIONS

"International Search Report (Form PCT/ISA/210) of PCT/JP2022/024269", dated Aug. 9, 2022, with English translation thereof, pp. 1-4.
Office Action of Taiwan Counterpart Application, with English translation thereof, issued on Jul. 26, 2023, pp. 1-11.
Office Action of Taiwan Counterpart Application, with English translation thereof, issued on Oct. 31, 2023, pp. 1-13.
Office Action of China Counterpart Application, with English translation thereof, issued on Jan. 29, 2024, pp. 1-15.
"Office Action of Deutsches Counterpart Application", issued on Apr. 24, 2024, with English translation thereof, p. 1-p. 6.

* cited by examiner

ELECTRON-BEAM IRRADIATION APPARATUS AND MAINTENANCE METHOD FOR ELECTRON-BEAM IRRADIATION APPARATUS

CROSS-REFERENCE TO RELATED APPLICATION

This application is a 371 application of the international PCT application serial no. PCT/JP2022/024269, filed on Jun. 17, 2022, which claims the priority benefits of Japan application no. 2021-104146, filed on Jun. 23, 2021. The entirety of each of the above—mentioned patent applications is hereby incorporated by reference herein and made a part of this specification.

TECHNICAL FIELD

The present invention relates to an electron-beam irradiation apparatus and a maintenance method for the electron-beam irradiation apparatus.

BACKGROUND

For example, Patent Literature 1 describes an electron-beam irradiation apparatus equipped with a power source device for generating a high voltage inside a pressure tank. In some electron-beam irradiation apparatuses, an accelerating tube is contained inside the pressure tank in addition to the power source device. The accelerating tube generates an electron beam by accelerating electrons using power supplied from the power source device. The accelerated electron beam in the accelerating tube is emitted outside the pressure tank through an outlet formed in the pressure tank.

CITATION LIST

Patent Literature

[Patent Literature 1] Japanese Unexamined Patent Publication No. H9-92495

SUMMARY OF INVENTION

Technical Problem

The inventors of the present invention have been studying how to simplify the maintenance of components inside a pressure tank in an electron-beam irradiation apparatus equipped with a power source device and an accelerating tube inside the pressure tank.

Solution to Problem

An electron-beam irradiation apparatus for solving the problem is an electron-beam irradiation apparatus including: a power source device; an accelerating tube that accelerating electrons by power supplied from the power source device so as to generate an electron beam; and a pressure tank that contains the power source device and the accelerating tube. The pressure tank is configured so as to be dividable into a first division body for containing the power source device and a second division body for containing the accelerating tube. The second division body has an outlet for emitting the electron beam emitted from the accelerating tube to an outside the pressure tank. The power source device has a connecting part connected to the second division body.

According to this configuration, when performing maintenance on the power source device, the first division body is separated from the second division body in a state where the power source device is connected to the second division body by the connecting part. Thus, by simply separating the first division body from the second division body, the power source device may be exposed from the pressure tank to be in a maintainable state. In other words, since the process of separating the first division body and the second division body to open the pressure tank and the process of exposing the power source device from the pressure tank become one process, it is possible to simplify the maintenance work of the power source device. Moreover, in a state where the first division body and the second division body are separated, it is possible to perform maintenance on the accelerating tube by simply inserting an arm into the second division body without having a worker enter inside the second division body.

In the electron-beam irradiation apparatus, the power source device includes a base movably supported relative to the first division body, and a power source body fixed to the base. In a state where the pressure tank is configured by combining the first division body and the second division body, an entirety of the power source body is contained inside the first division body.

According to this configuration, the entirety of the power source body is contained inside the first division body. That is, in this configuration, the power source body is not entering the second division body. Thus, by removing the first division body from the second division body, it is possible to expose a wider range of the power source body from the pressure tank.

In the electron-beam irradiation apparatus, the connecting part is detachably connected to the second division body.

According to this configuration, by removing the connecting part from the second division body, it is possible to separate the power source device from the second division body.

In the electron-beam irradiation apparatus, in a direction in which the first division body and the second division body are separated from each other, the second division body is on a fixed side, and the first division body is on a movable side.

According to this configuration, the first division body may be separated from the second division body in a state where the connection between mechanisms such as the scanning tube is kept connected to the accelerating tube. As a result, it is possible to simplify the process of separating the first division body and the second division body in order to expose the power source device from the pressure tank.

In the electron-beam irradiation apparatus, the first division body and the second division body are separated in a direction along an axis line of the pressure tank, and the fixed angle of the second division body relative to the first division body is configured to be changeable in a circumferential direction centered on the axis line.

According to this configuration, by changing the fixed angle of the second division body relative to the first division body, it is possible to change the direction of the outlet of the second division body, that is, the outlet direction of the accelerating tube. Thus, it is possible to simplify the design using the same pressure tank while changing the outlet direction of the accelerating tube.

A maintenance method for the electron-beam irradiation apparatus that solves the problem is a maintenance method for the above-described electron-beam irradiation apparatus, and includes: an exposure process of exposing the power source device from the pressure tank by separating the first division body from the second division body in a state that the connecting part is connected to the second division body.

According to this embodiment, by simply separating the first division body from the second division body in the exposure process, the power source device may be exposed from the pressure tank to be in a state that is maintainable. In other words, since the process of separating the first division body and the second division body to open the pressure tank and the process of exposing the power source device from the pressure tank become one process, it is possible to simplify the maintenance work of the power source device.

Effects of the Invention

According to the electron-beam irradiation apparatus and the maintenance method of the electron-beam irradiation apparatus of the present invention, it is possible to simplify the maintenance of components inside the pressure tank.

DESCRIPTION OF EMBODIMENTS

Hereinafter, an embodiment of the electron-beam irradiation apparatus and the maintenance method for the electron-beam irradiation apparatus will be described with reference to the drawings. In the drawings, for convenience of explanation, some parts of the configuration may be exaggerated or simplified. Also, the dimensional ratios of each part may be different from those in reality. Further, in this specification, "vertical" and "orthogonal" include not only strictly vertical and orthogonal cases but also cases that are approximately vertical and orthogonal within the range where the actions and effects in this embodiment are achieved.

(Schematic Configuration of an Electron-Beam Irradiation Apparatus 10)

Figure 1:
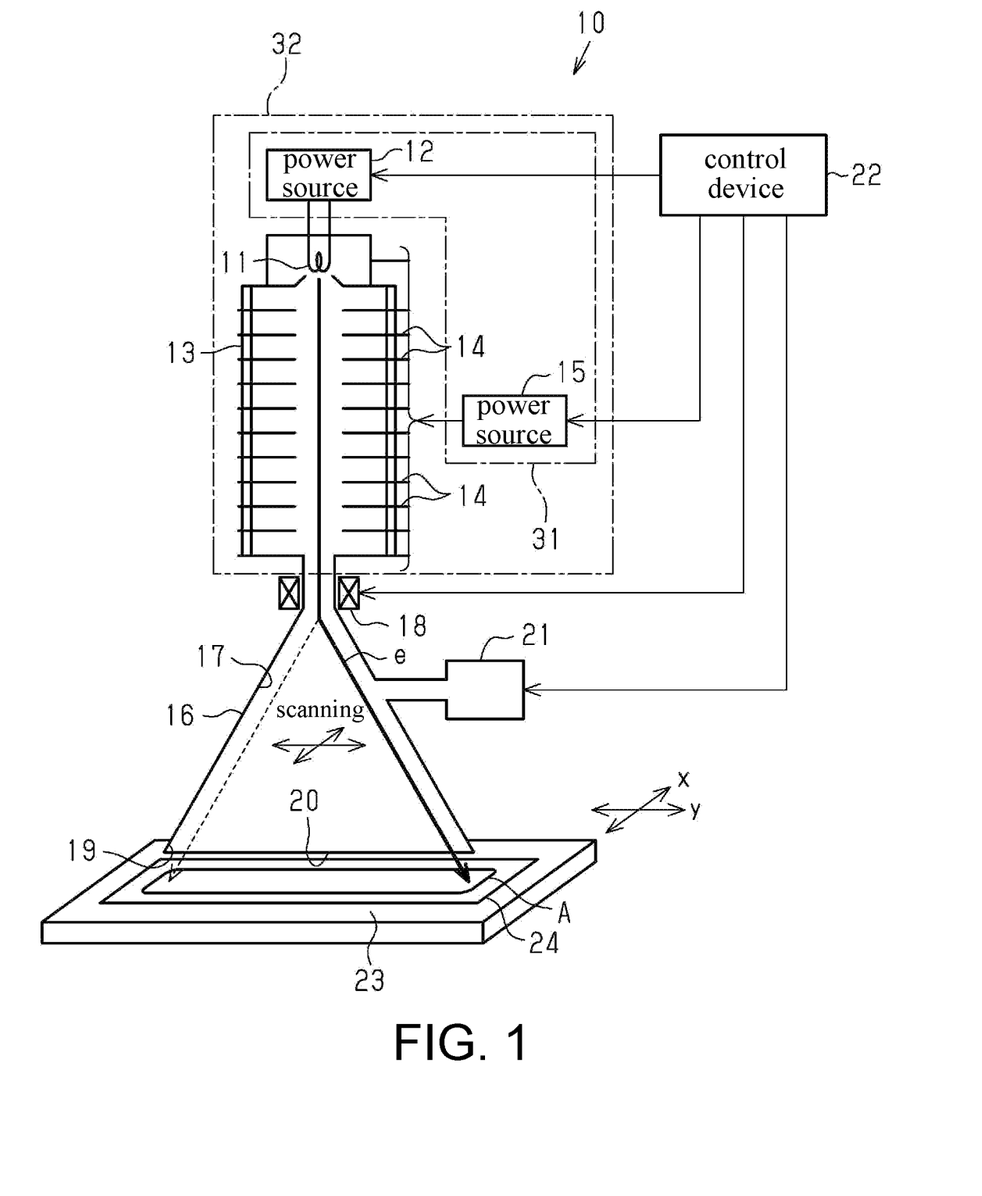
FIG. 1 is a schematic configuration diagram of an electron-beam irradiation apparatus in an embodiment.

An electron-beam irradiation apparatus 10 of the present embodiment shown in FIG. 1 is a scanning type electron-beam irradiation apparatus. The electron-beam irradiation apparatus 10 is provided with, for example, a tungsten filament 11 that performs a thermal electron emission. The filament 11 emits electrons by heating itself based on the power source from a filament power source 12 included in a power source device 31. The filament 11 is provided on the upper end side of an accelerating tube 13.

The accelerating tube 13 has a tubular shape with a closed upper end side, where the filament 11 is arranged. The accelerating tube 13 has a plurality of accelerating electrodes 14 arranged in parallel with its own tube axis line direction. Based on the power source from an accelerating electrode power source 15 included in the power source device 31, the accelerating electrodes 14 generate an electric field that converges and accelerates the electrons emitted from the filament 11 downward. In other words, in the accelerating tube 13, an electron flow directed downward along the tube axis line direction, that is, an electron beam "e", is generated by the electric field generated by the accelerating electrodes 14. The lower end of the accelerating tube 13 is connected to a scanning tube 16. An internal space 17 of the accelerating tube 13 and the scanning tube 16 communicate with each other, and the electron beam "e" advances from the accelerating tube 13 to the scanning tube 16 side in the internal space 17.

The scanning tube 16 has a shape that is narrow in width at the upper end side and expands as it goes downward. A scanning coil 18 is provided at the narrow upper end of the scanning tube 16. Based on the current passing through itself, the scanning coil 18 deflects the direction of the electron beam "e" generated in the accelerating tube 13, that is, performs scanning of the electron beam "e". For example, an opening window part 19 having a substantially rectangular shape is provided at the lower end of the scanning tube 16, and a window foil 20 having a substantially rectangular shape is attached to the opening window part 19. The window foil 20 is for sealing the opening window part 19 while allowing the electron beam "e" to pass through. In other words, the internal space 17 spanning between the accelerating tube 13 and the scanning tube 16 is configured as a sealed space. The internal space 17 is maintained in a vacuum state at least during the period when the electron beam "e" is generated, for example, by driving a vacuum pump 21 connected to the scanning tube 16.

The filament power source 12, the accelerating electrode power source 15, the scanning coil 18, and the vacuum pump 21 are controlled by a control device 22. The control device 22 adjusts the output of the electron beam "e" through the filament power source 12 and the accelerating electrode power source 15, performs scanning control of the electron beam "e" through the scanning coil 18, and adjusts the vacuum of the internal space 17 of the accelerating tube 13 and the scanning tube 16 through the vacuum pump 21.

Moreover, the electron beam "e" emitted through the window foil 20 mounted on the opening window part 19 is irradiated onto an object 24 to be irradiated, which is conveyed in a conveying direction "x" by a conveying device 23, and performs a predetermined treatment on the object 24 to be irradiated. In this case, the electron-beam irradiation apparatus 10 is arranged such that the longitudinal direction of the opening window part 19 having the substantially rectangular shape faces a conveying orthogonal direction "y" of the conveying device 23. Further, a predetermined scanning of the electron beam "e", including the conveying direction "x" and the conveying orthogonal direction "y", is performed, and irradiation is performed on a substantially rectangular-shaped irradiation area A corresponding to the opening window part 19. As an irradiation effect of the electron beam "e" on the object 24 to be irradiated, it may be expected to improve material properties, add functions, and achieve sterilization or disinfection.

(Pressure Tank 32)

The power source device 31 and the accelerating tube 13 are contained inside a pressure tank 32. An insulating gas, such as SF6 gas, is filled inside the pressure tank 32. The internal pressure of the pressure tank 32 is set to a high pressure of about 0.5 MPa, for example. The pressure tank 32 is made of a conductor, such as metal. Note that the pressure tank 32 is electrically grounded, for example.

Figure 2:
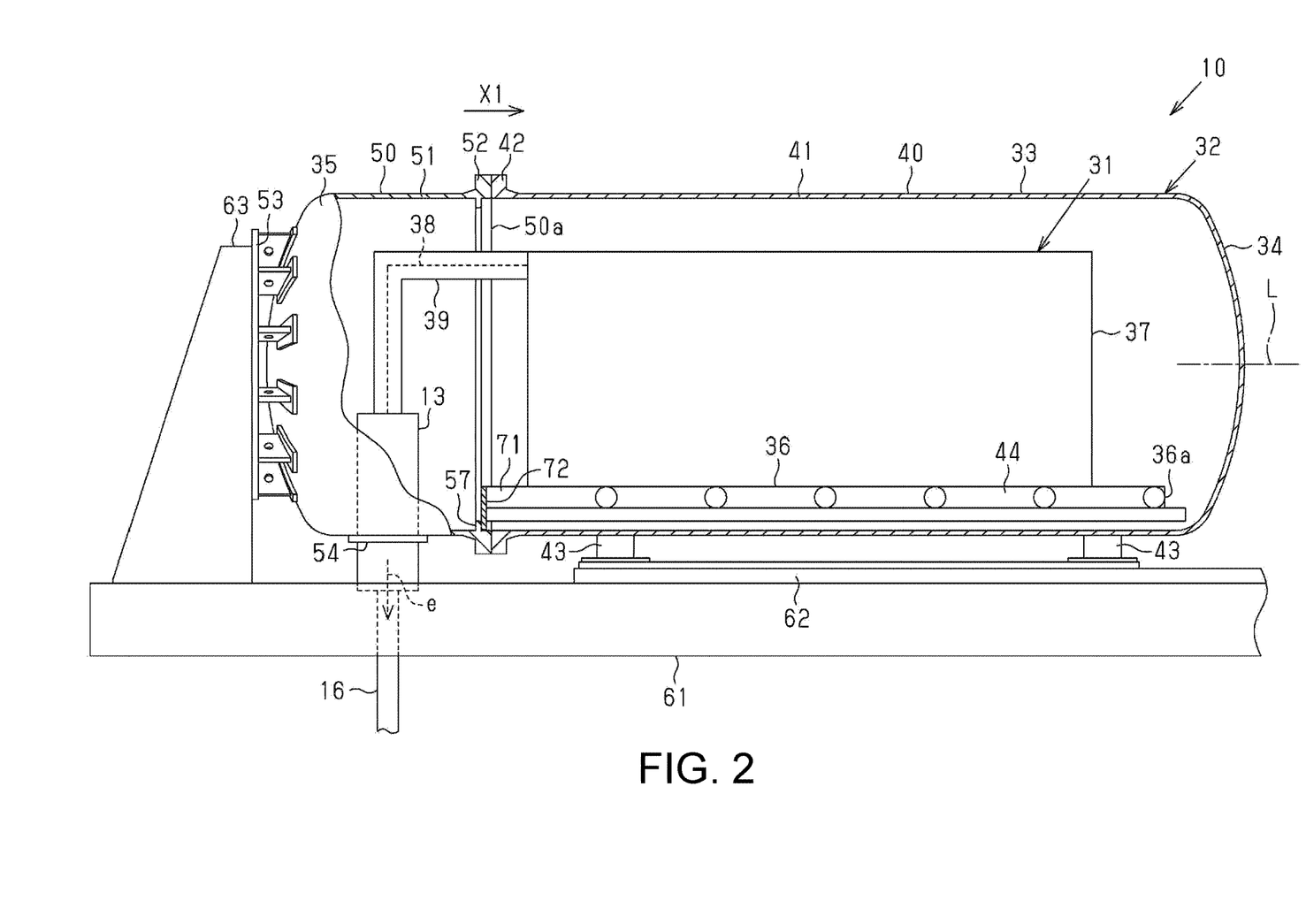
FIG. 2 is a schematic diagram showing the configuration around a pressure tank in the same embodiment.

As shown in FIG. 2, the pressure tank 32 has a shape extending along a direction X1. The pressure tank 32 includes a peripheral wall 33 forming a tubular shape centered on an axis line L along the direction X1, and bottom walls 34 and 35 respectively provided at two ends of the peripheral wall 33 in the direction X1. The peripheral wall 33 has, for example, a cylindrical shape centered on the axis line L. Since the inside of the pressure tank 32 is set to high pressure, it is preferable that the shape of the peripheral wall 33, as viewed from the direction along the axis line L, is cylindrical.

The pressure tank 32 has a divided structure including a first division body 40 and a second division body 50. In this embodiment, the pressure tank 32 is configured by assembling the first division body 40 and the second division body 50 with each other.

The first division body 40 has a first peripheral wall part 41 and the bottom wall 34, in which the first peripheral wall part 41 constitutes a part of the peripheral wall 33. The second division body 50 has a second peripheral wall part 51 and the bottom wall 35, in which the second peripheral wall part 51 constitutes a part of the peripheral wall 33. Each of the first peripheral wall part 41 and the second peripheral wall part 51 has, for example, a cylindrical shape. In the peripheral wall 33 of the pressure tank 32, the boundary between the first peripheral wall part 41 and the second peripheral wall part 51 forms, for example, a plane perpendicular to the axis line L. Also, the boundary between the first peripheral wall part 41 and the second peripheral wall part 51 is set at a position offset from the center of the pressure tank 32 in the direction X1, for example. In terms of dimensions in the direction X1, the second peripheral wall part 51 is smaller than the first peripheral wall part 41.

The first division body 40 has a first flange part 42 at an end opposite to the bottom wall 34 in the first peripheral wall part 41. The first flange part 42 is provided over the entire circumference of the end of the first peripheral wall part 41. Note that the thickness of the first flange part 42 in the direction X1 is, for example, set to be thicker than the radial thickness of the first peripheral wall part 41.

The second division body 50 has a second flange part 52 at an end opposite to the bottom wall 35 in the second peripheral wall part 51. The second flange part 52 is provided over the entire circumference of the end of the second peripheral wall part 51. Note that the thickness of the second flange part 52 in the direction X1 is, for example, set to be thicker than the radial thickness of the second peripheral wall part 51.

The first flange part 42 and the second flange part 52 are connected to each other, for example, by bolts (not shown) in a state where they are in contact with each other. By connecting the first flange part 42 and the second flange part 52 to each other, a sealed space is formed inside the pressure tank 32.

The first division body 40 is supported by a support stand 61. The first division body has leg parts 43. The leg parts 43 are, for example, provided on the outer peripheral surface of the first peripheral wall part 41. The leg parts 43 are supported by a first rail 62 provided on the upper surface of the support stand 61. The first rail 62 extends along the axis line L. The leg parts 43 are movable in the direction along the axis line L with respect to the first rail 62. That is, the first division body 40 is configured to be movable in the direction along the axis line L with respect to the support stand 61. Moreover, in the rotational direction centered on the axis line L, the fixed orientation of the first division body 40 with respect to the support stand 61 is constant in the direction where the leg parts 43 face the support stand 61 side.

The second division body 50 is configured as a fixed side with respect to the first division body 40, which is movable along the axis line L. The second division body 50 is, for example, fixed to the support stand 61. For example, the second division body 50 has a fixed seat 53 on the bottom wall 35. The fixed seat 53 is fixed to the outer surface of the bottom wall 35. The fixed seat 53 is fixed to a support part 63 of the support stand 61, for example, by bolt fastening.

(Internal Configuration of the Pressure Tank 32)

The first division body 40 has a second rail 44 extending along the axis line L inside it. The second rail 44 is fixed to the inner peripheral surface of the first peripheral wall part 41. The second rail 44 is, for example, provided in a pair arranged in a horizontal direction perpendicular to the axis line L.

The power source device 31 has a base 36 and a power source body 37 supported by the base 36. The base 36 is supported by the second rail 44. The base 36 is configured to be relatively movable in the direction along the axis line L with respect to the second rail 44. Moreover, the second rail 44 has an unillustrated lock part that may fix the base 36 in the direction along the axis line L.

The power source body 37 supported by the base 36 is configured to include the filament power source 12 and the accelerating electrode power source 15. At least a part of the power source body 37 is contained inside the first division body 40. FIG. 2 shows, as an example, a configuration in which the entire power source body 37 is contained inside the first division body 40. The overall length of the power source body 37 in the direction X1 is contained within the inner side of the first peripheral wall part 41. In the direction along the axis line L, the dimension of the power source body 37 is shorter than the dimension of the base 36.

Inside the second division body 50, the accelerating tube 13 is contained. The accelerating tube 13 is installed on the inner peripheral surface of the second peripheral wall part 51. An outlet 54 communicating the inside and outside of the pressure tank 32 is provided in the second peripheral wall part 51. Inside the pressure tank 32, the electron beam outlet of the accelerating tube 13 is connected to the outlet 54 of the second peripheral wall part 51. Outside the pressure tank 32, the scanning tube 16 is connected to the outlet 54 of the second peripheral wall part 51.

The power source body 37 and the accelerating tube 13 are connected by an electric wire 38. The electric wire 38 includes a wire connecting the filament power source 12 and the filament 11, and a wire connecting the accelerating electrode power source 15 and the accelerating electrodes 14. The electric wire 38 is passed through a shield pipe 39 made of a conductor. The shield pipe 39 protects the electric wire 38. Moreover, the boundary between the first peripheral wall part 41 and the second peripheral wall part 51 is set at a position between the power source body 37 and the accelerating tube 13 contained in the pressure tank 32 in the direction along the axis line L.

Figure 3:
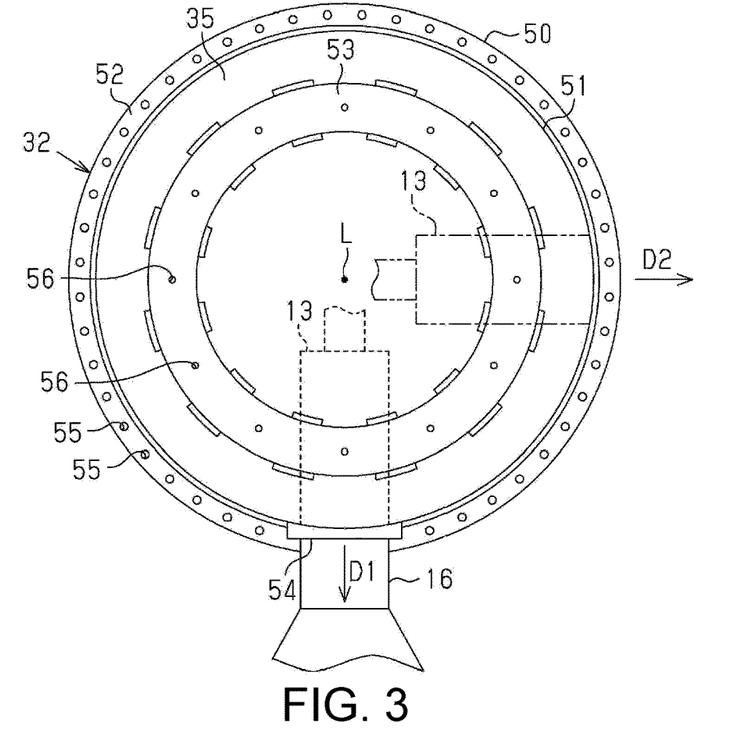
FIG. 3 is a side view of the pressure tank as seen from a side of a second division body in the same embodiment.

As shown in FIG. 3, a plurality of first bolt insertion holes 55 is formed in the second flange part 52 of the second division body 50, for example. Each of the first bolt insertion holes 55 penetrates the second flange part 52 along the axis line L. The plurality of first bolt insertion holes 55 is provided at equal intervals in the circumferential direction centered on the axis line L, for example. Moreover, in the first flange part 42 of the first division body 40, bolt insertion holes similar to the first bolt insertion holes 55 are formed, although not shown. And, by tightening bolts (not shown)

that penetrate both the bolt insertion holes of the first flange part 42 and the first bolt insertion holes 55 of the second flange part 52, the first flange part 42 and the second flange part 52 are fixed to each other.

The fixed seat 53 of the second division body 50 has, for example, an annular shape centered on the axis line L. In the description of this specification, the term "annular shape" is used to include both a continuous shape without ends and a discontinuous shape having a gap like a C-shape. Also, the term "annular shape" used in the description of this specification includes not only those composed of one component but also those that form an annular shape by combining multiple components. The fixed seat 53 has, for example, a circular annular shape in the direction X1 view. A plurality of second bolt insertion holes 56 is formed in the fixed seat 53. Each of the second bolt insertion holes 56 penetrates the fixed seat 53 along the axis line L. The plurality of second bolt insertion holes 56 is provided at equal intervals in the circumferential direction centered on the axis line L, for example. The fixed seat 53 is fixed to the support part 63 by bolts (not shown) inserted into the second bolt insertion holes 56.

In the circumferential direction centered on the axis line L, the fixed angle of the second division body 50 relative to the first division body 40 is not limited to one but may be changed at least in two angles.

In the example shown in FIG. 2 and FIG. 3, the second division body 50 is fixed to the first division body 40 such that the outlet direction of the accelerating tube 13 faces the support stand 61 side, that is, the lower side in the vertical direction. In FIG. 3, the outlet direction of the accelerating tube 13 toward the lower side in the vertical direction is defined as Dl. With this fixed angle of the second division body 50 as a first position, the second division body 50 may be fixed to the first division body 40 by changing the angle from the first position to a second position where the second division body 50 is rotated 45 degrees around the axis line L. In FIG. 3, the accelerating tube 13 when the second division body 50 is fixed at the second position is shown by a two-dot chain line. An outlet direction D2 of the accelerating tube 13 at the second position is parallel to the horizontal.

The change angle of the fixed position of the second division body 50 is determined by the formation interval of the first bolt insertion holes 55 in the circumferential direction. In this embodiment, the fixed angle of the second division body 50 relative to the first division body 40 may be changed to a direction other than the first position and the second position. For example, the outlet direction of the accelerating tube 13 may be changed to a direction 180 degrees opposite to the second position, upward in the vertical direction, or inclined with respect to the outlet direction D1 at the first position and the outlet direction D2 at the second position.

Figure 4:
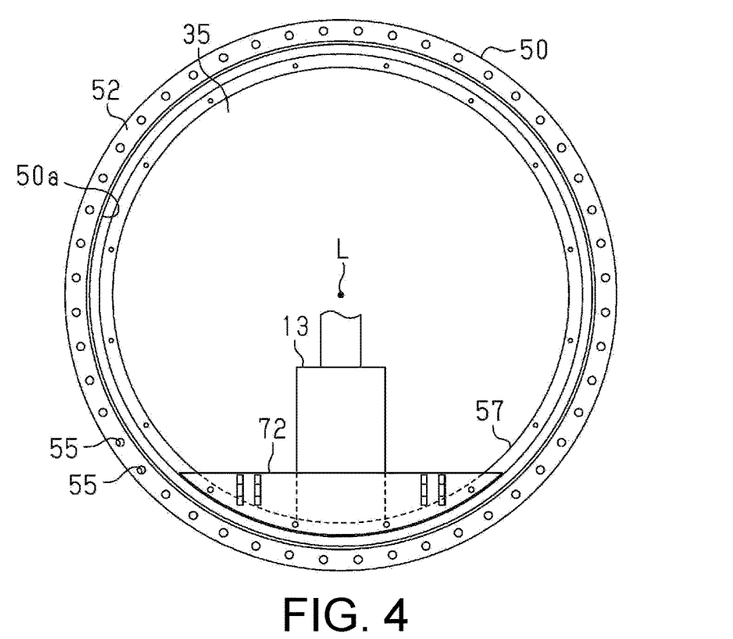
FIG. 4 is a side view of the second division body of the pressure tank as seen from an opening side in the same embodiment.

As shown in FIG. 2 and FIG. 4, the power source device 31 has a connecting part 71 connected to the second division body 50. The connecting part 71 is provided on the base 36 of the power source device 31. For example, the connecting part 71 is provided at one end of the base 36 in the direction along the axis line L. The connecting part 71 is connected to the second division body 50 via a connection plate 72, which is a separate component from the base 36, for example.

The second division body 50 has a connected part 57 to which the connection plate 72 is fixed. The connected part 57, for example, forms a flange shape projecting radially inward from the inner peripheral surface of the second peripheral wall part 51. The connected part 57, for example, forms a continuous or intermittent annular shape along the circumferential direction centered on the axis line L. In the direction along the axis line L, the formation position of the connected part 57 is set within the range of the thickness of the second flange part 52, for example. That is, the connected part 57 is located radially inside the second flange part 52. The connection plate 72 may be detachably fixed to the connected part 57 by bolts, for example.

The connecting part 71 of the base 36 may be detachably fixed to the connection plate 72 by means such as bolts, for example. The fixed position of the connection plate 72 relative to the connected part 57 may be changed in the circumferential direction centered on the axis line L. As a result, it is possible to fix the connecting part 71 to the connection plate 72 regardless of the fixed angle of the second division body 50 in the circumferential direction.

As shown in FIG. 2, a stopper (not shown) is provided at the end 36a on the opposite side of the connecting part 71 in the base 36. The stopper engages with the engaged part of the second rail 44 in the direction along the axis line L. As a result, in the direction along the axis line L, the base 36 is prevented from falling off the second rail 44.

Next, a description will be given of the maintenance method for components inside the pressure tank 32 in the electron-beam irradiation apparatus 10.

During the maintenance of the power source device 31, first, a gas recovery process is performed to remove the insulating gas filled inside the pressure tank 32.

Figure 5:
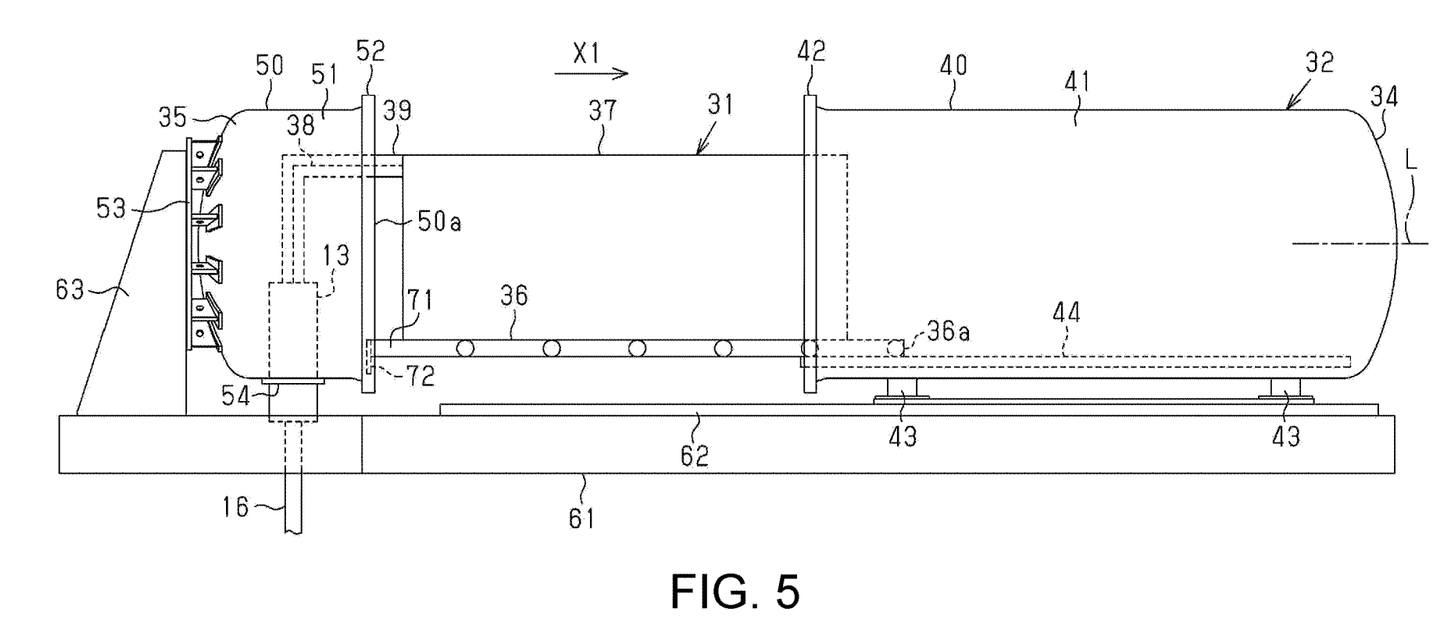
FIG. 5 is a schematic diagram for explaining the maintenance mode in the electron-beam irradiation apparatus of the same embodiment.

Next, an exposure process is performed to expose the power source device 31 from the pressure tank 32. In the exposure process, first, the connection between the first flange part 42 and the second flange part 52 is released. Then, as shown in FIG. 5, the first division body 40 is moved in a direction away from the second division body 50, that is, in the direction X1. At this time, since the connecting part 71 of the base 36 is connected to the connected part 57 of the second division body 50, the base 36 and the power source body 37 do not move together with the first division body 40. As a result, by moving the first division body 40 in the direction X1, a majority of the power source body 37 is exposed from the pressure tank 32. In this manner, in a state where the power source body 37 is exposed from the pressure tank 32, the power source body 37 may be maintained. This allows for the elimination of the need for workers to enter confined spaces within the pressure tank 32 to perform tasks.

In this embodiment, the second division body 50 is mainly a part for containing the accelerating tube 13, and in the dimension along the axis line L, the second division body 50 is shorter than the first division body 40. Thus, since the distance from the opening 50a of the second division body 50 to the accelerating tube 13 is short, it is possible to easily perform maintenance on the accelerating tube 13, the shield pipe 39, and the electric wire 38 when the first division body 40 is separated from the second division body 50. Thus, it is possible to eliminate the need for workers to perform tasks inside the confined space of the second division body 50.

Next, a description will be given of the mode of changing the fixed angle of the second division body 50 in the circumferential direction.

Figure 6:
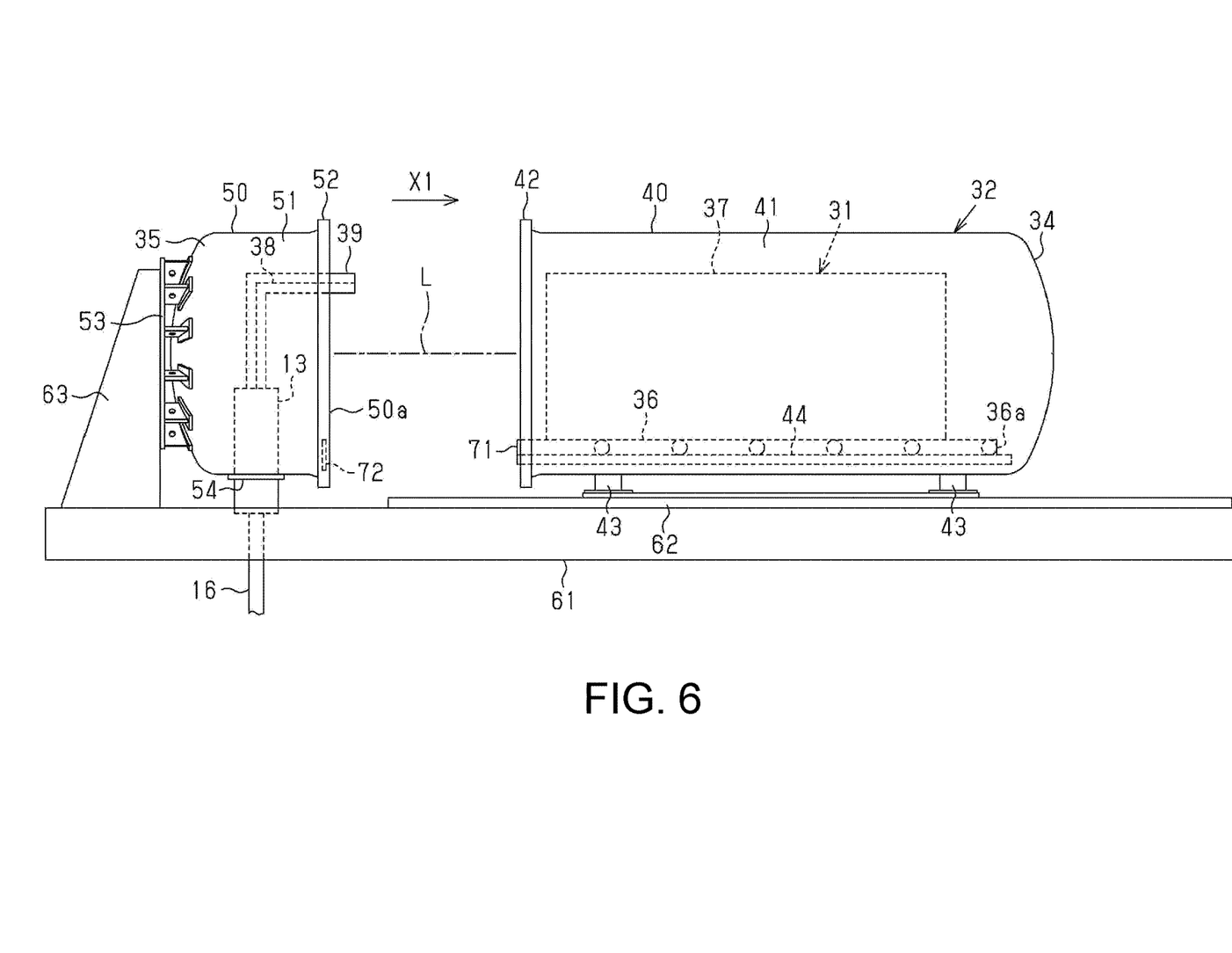
FIG. 6 is a schematic diagram for explaining the maintenance mode in the electron-beam irradiation apparatus of the same embodiment.

While releasing the connection between the connecting part 71 and the connected part 57, the base 36 is fixed to the second rail 44 by the lock part. In this embodiment, for example, the state where the connection plate 72 is fixed to the connected part 57 is maintained, and the fixation of the connecting part 71 to the connection plate 72 is removed. Also, the connection between the electric wire 38 and the power source body 37 is disconnected. In this state, as shown in FIG. 6, the first division body 40 is moved in the direction X1. Then, the first division body 40 is separated from the second division body 50 together with the power source device 31.

Next, the fixation of the fixed seat 53 to the support part 63 is removed. As a result, the second division body 50 is removed from the support stand 61. In this state, the fixed angle of the second division body 50 in the circumferential direction may be changed along with the accelerating tube 13, the shield pipe 39, and the electric wire 38. After changing the fixed angle of the second division body 50 in the circumferential direction, the fixed seat 53 is fixed to the support part 63. This changes the direction of the outlet 54 of the second division body 50, that is, the outlet direction of the accelerating tube 13. The fixed position of the connection plate 72 in the circumferential direction is changed to a position where it may be fixed to the connecting part 71 of the base 36 according to the fixed angle of the second division body 50 in the circumferential direction.

Moreover, as shown in FIG. 6, it is also possible to perform maintenance on the accelerating tube 13, the shield pipe 39, and the electric wire 38 in a state where the connection between the connecting part 71 and the connected part 57 is released and the first division body is separated from the second division body 50 together with the power source device 31.

An explanation will be given of the effects of this embodiment.

(1) The electron-beam irradiation apparatus 10 includes the power source device 31; the accelerating tube 13 that accelerates electrons by power supplied from the power source device 31 so as to generate the electron beam "e"; and the pressure tank 32 that contains the power source device 31 and the accelerating tube 13. The pressure tank 32 is configured so as to be dividable into the first division body 40 that contains the power source device 31 and the second division body 50 that contains the accelerating tube 13. The second division body 50 has the outlet 54 for emitting the electron beam "e" emitted from the accelerating tube 13 to an outside of the pressure tank 32. The power source device 31 has a connecting part 71 connected to the second division body 50. The maintenance method for the electron-beam irradiation apparatus 10 includes an exposure process of exposing the power source device 31 from the pressure tank 32 by separating the first division body 40 from the second division body 50 in a state that the connecting part 71 is connected to the second division body 50.

According to this embodiment, when performing maintenance on the power source device 31, the first division body 40 is separated from the second division body 50 in a state where the power source device 31 is connected to the second division body 50 by the connecting part 71. As a result, by simply separating the first division body 40 from the second division body 50, the power source device 31 may be exposed from the pressure tank 32 and made maintainable. That is, since the process of separating the first division body 40 and the second division body 50 to open the pressure tank 32 and the process of exposing the power source device 31 from the pressure tank 32 become one process, it is possible to simply the maintenance work of the power source device 31. Moreover, in a state where the first division body 40 and the second division body 50 are separated, it is possible for a work to maintain the accelerating tube 13 by inserting only an arm into the second division body 50 without entering the second division body 50.

(2) The power source device 31 includes the base 36 movably supported relative to the first division body 40, and the power source body 37 fixed to the base 36. In a state where the pressure tank 32 is configured by combining the first division body 40 and the second division body 50, an entirety of the power source body 37 is contained inside the first division body 40. According to this configuration, the entirety of the power source body 37 is contained inside the first division body 40. That is, it is a configuration in which the power source body 37 does not enter the second division body 50. Thus, by removing the first division body 40 from the second division body 50, it becomes possible to expose a wider range of the power source body 37 from the pressure tank 32.

(3) The connecting part 71 is detachably connected to the second division body 50. According to this configuration, by removing the connecting part 71 from the second division body 50, it is possible to separate the power source device 31 from the second division body 50. In a state where the connection of the connecting part 71 to the second division body 50 is disconnected, the first division body 40 may be moved together with the power source device 31, and the first division body 40 and the power source device 31 may be separated from the second division body 50. In a state where the first division body 40 and the power source device 31 are separated from the second division body 50, it is possible to easily perform maintenance on the accelerating tube 13, the shield pipe 39, and the electric wire 38. Further, in a state where the first division body 40 and the power source device 31 are separated from the second division body 50, it is possible to change the fixed angle of the second division body 50 in the circumferential direction.

(4) In a direction in which the first division body 40 and the second division body 50 are separated from each other, that is, in a direction along the axis line L, the second division body 50 is on a fixed side and the first division body 40 is on a movable side. According to this configuration, the first division body 40 may be separated from the second division body 50 in a state where mechanisms such as the scanning tube 16 are connected to the accelerating tube 13. As a result, it is possible to simplify the process of separating the first division body 40 and the second division body 50 in order to expose the power source device 31 from the pressure tank 32.

(5) The first division body 40 and the second division body 50 are separated in the direction along the axis line L of the pressure tank 32. And, the electron-beam irradiation apparatus 10 is configured to be able to change the fixed angle of the second division body 50 with respect to the first division body 40 in the circumferential direction centered on the axis line L. According to this configuration, by changing the fixed angle of the second division body 50 with respect to the first division body 40, it is possible to change the direction of the outlet 54 of the second division body 50, that is, the outlet direction of the accelerating tube 13. Thus, it is possible to simplify the design using the same pressure tank 32 while being able to change the outlet direction of the accelerating tube 13.

This embodiment may be implemented with the following modifications. This embodiment and the following modification examples may be combined with each other within a range that does not technically contradict.

In the exposure process of the above embodiment, when releasing the connecting part 71 from the second division body 50, the connection plate 72 is kept in a state where it is fixed to the connected part 57, and the fixation of the connecting part 71 to the connection plate 72 is removed, but not particularly limited thereto. The connection of the connecting part 71 to the second division body 50 may be released by removing the fixation of the connection plate 72 to the connected part 57. Moreover, for example, the connection plate 72 may be provided inseparably from the base 36 and configured as a part of the base 36. In this case, the connection plate 72 constitutes a connecting part that is connected to the second division body 50.

In the above embodiment, the second division body 50 is fixed to the support stand 61, but alternatively, for example, the second division body 50 may be configured to be fixed to a wall of a facility unrelated to the support stand 61.

In the above embodiment, the fixed angle of the second division body 50 in the circumferential direction is changeable, but not limited thereto. The fixed angle of the second division body 50 in the circumferential direction may be configured to be unchangeable.

In the above embodiment, the second division body 50 is configured as a fixed side with respect to the first division body 40 that is movable along the axis line L, but this relationship may be reversed, that is, the first division body 40 may be the fixed side and the second division body 50 may be the movable side.

In the above embodiment, the connecting part 71 is detachable with respect to the second division body 50, but not limited thereto. The connecting part 71 may be fixed to the second division body 50 in a non-separable manner.

In the above embodiment, the entire power source body 37 is contained inside the first division body 40 in a state where the pressure tank 32 is configured by combining the first division body 40 and the second division body 50, but not particularly limited thereto. For example, in a state where the pressure tank 32 is configured by combining the first division body 40 and the second division body 50, one end of the power source body 37 in the axis line L direction may be configured to enter the second division body 50.

In the above embodiment, the first flange part 42 and the second flange part 52 are bolted together as a connection structure between the first division body 40 and the second division body 50, but not particularly limited thereto. For example, the connection structure may be configured such that the first flange part 42 and the second flange part 52 are clamped in the axis line L direction by means such as a clamp.

In the above embodiment, the boundary between the first peripheral wall part 41 and the second peripheral wall part 51 forms, for example, a plane perpendicular to the axis line L. However, alternatively, it may form a plane inclined with respect to the axis line L or a non-planar shape.

The above embodiment is applied to the scanning electron-beam irradiation apparatus that irradiate the irradiation area A by scanning the electron beam "e" by the scanning coil 18, but it may also be applied to an area-type electron-beam irradiation apparatus that omits the scanning coil by using a plurality of filaments corresponding to the irradiation area.

What is claimed is:

1. An electron-beam irradiation apparatus, comprising:
   a power source device;
   an accelerating tube that accelerates electrons by power supplied from the power source device so as to generate an electron beam; and
   a pressure tank that contains the power source device and the accelerating tube,
   wherein
   the pressure tank is configured so as to be dividable into a first division body that contains the power source device and a second division body that contains the accelerating tube,
   the second division body has an outlet for emitting the electron beam emitted from the accelerating tube to an outside of the pressure tank, and
   the power source device has a connecting part connected to the second division body,
   wherein
   the first division body and the second division body are separated in a direction along an axis line of the pressure tank, and
   in a circumferential direction centered on the axis line, a fixed angle of the second division body relative to the first division body is configured to be changeable.

2. The electron-beam irradiation apparatus according to claim 1, wherein
   the power source device comprises: a base, being movably supported relative to the first division body; and a power source body, being fixed to the base, and
   in a state where the pressure tank is configured by combining the first division body and the second division body, an entirety of the power source body is contained inside the first division body.

3. The electron-beam irradiation apparatus according to claim 1, wherein
   the connecting part is detachably connected to the second division body.

4. The electron-beam irradiation apparatus according to claim 1, wherein
   in a direction in which the first division body and the second division body are separated from each other, the second division body is on a fixed side, and the first division body is on a movable side.

5. A maintenance method for the electron-beam irradiation apparatus according to claim 1, comprising:
   an exposure process of exposing the power source device from the pressure tank by separating the first division body from the second division body in a state that the connecting part is connected to the second division body.

* * * * *